US008235068B2

(12) United States Patent
Christenson

(10) Patent No.: US 8,235,068 B2
(45) Date of Patent: Aug. 7, 2012

(54) SUBSTRATE PROCESSING SYSTEMS AND RELATED METHODS

(75) Inventor: Kurt K. Christenson, Minnetonka, MN (US)

(73) Assignee: FSI International, Inc., Chaska, MN (US)

( * ) Notice: Subject to any disclaimer, the term of this patent is extended or adjusted under 35 U.S.C. 154(b) by 583 days.

(21) Appl. No.: 12/387,314

(22) Filed: Apr. 30, 2009

(65) Prior Publication Data

US 2009/0277507 A1    Nov. 12, 2009

Related U.S. Application Data

(60) Provisional application No. 61/127,288, filed on May 12, 2008.

(51) Int. Cl.
*G05D 7/06* (2006.01)
(52) U.S. Cl. .............. 137/624.11; 137/111; 137/118.01; 137/119.1; 137/625
(58) Field of Classification Search ............ 137/624.11, 137/624.12, 111, 118.01, 119.1, 625
See application file for complete search history.

(56) References Cited

U.S. PATENT DOCUMENTS

| | | | |
|---|---|---|---|
| 5,169,408 A | 12/1992 | Biggerstaff et al. | |
| 5,362,989 A | 11/1994 | Hennedy | |
| 5,658,615 A | 8/1997 | Hasebe et al. | |
| 5,756,155 A | 5/1998 | Tzeng et al. | |
| 5,985,357 A | 11/1999 | Sanada | |
| 6,405,744 B1 * | 6/2002 | LaPant | 137/1 |
| 6,551,403 B1 | 4/2003 | Crabtree | |
| 6,612,319 B1 | 9/2003 | Rangarajan et al. | |
| 7,156,927 B2 | 1/2007 | Christenson et al. | |
| 7,228,873 B2 * | 6/2007 | Ku et al. | 137/624.11 |
| 7,312,161 B2 | 12/2007 | Siefering et al. | |
| 2003/0094196 A1 | 5/2003 | Siefering et al. | |
| 2003/0226577 A1 | 12/2003 | Orll et al. | |
| 2005/0263066 A1 | 12/2005 | Lubomirsky et al. | |
| 2005/0276909 A1 | 12/2005 | Benson et al. | |

FOREIGN PATENT DOCUMENTS

| | | |
|---|---|---|
| EP | 1204139 | 5/2002 |
| EP | 1335412 | 8/2003 |
| EP | 1708252 | 10/2006 |
| WO | WO 01/28950 | 4/2001 |
| WO | WO 2008/029848 | 3/2008 |

* cited by examiner

*Primary Examiner* — Kevin Lee
(74) *Attorney, Agent, or Firm* — Kagan Binder, PLLC

(57) ABSTRACT

A system for processing one or more substrates according to the present invention includes a diversion valve that can deliver two or more process fluids to a dispensing device through a common line/pipe. The present invention also includes related methods.

20 Claims, 10 Drawing Sheets

SUBSTRATE PROCESSING SYSTEMS AND RELATED METHODS

PRIORITY

The present non-provisional patent Application claims priority under 35 U.S.C. §119(e) from U.S. Provisional Patent Application having Ser. No. 61/127,288, filed on May 12, 2008, by Kurt K. Christenson and titled SUBSTRATE PROCESSING SYSTEMS AND RELATED METHODS, wherein the entirety of said provisional patent application is incorporated herein by reference.

FIELD OF THE INVENTION

The present invention relates to systems and methods for processing substrate(s) with fluids, for example, treating microelectronic substrate(s) in one or more single wafer process stations.

BACKGROUND OF THE INVENTION

Systems and methods for processing substrates such as microelectronic devices are known. For example, U.S. Pat. No. 7,156,927 (Christenson et al.), the entirety of which reference is incorporated herein by reference for all purposes, discloses in the Abstract that a treating chemical is introduced to a bath under conditions effective to at least partially envelop the object to be treated in eddy currents of the bath liquid, followed by introducing non-treating liquid into the bath under conditions effective to at least partially envelop the object to be treated in eddy currents of the bath liquid.

As another example, U.S. Pat. No. 7,312,161 (Siefering et al.), the entirety of which reference is incorporated herein by reference for all purposes, discloses in the Abstract that the variability of immersion processes for treatment of semiconductor devices can be significantly lowered by initiating the termination of a treatment process according to a predetermined treatment termination protocol in a manner that takes into account the contribution of, in particular, the treatment that is carried out during the period of time in the treatment process in which the treatment process is being terminated. In a preferred embodiment, conditions that indicate the progress of the treatment on a real time basis are monitored, and the timing of the initiation of the termination process is additionally based on the calculated amount of treatment and treatment rate of the process in progress. See also, U.S. Pub. No. 2003/0094196 (Siefering et al.), the entirety of which reference is incorporated herein by reference for all purposes, as a reference directed to advanced process control for immersion processing.

The manufacture of substrates can often be very complex, requiring a plurality of processing steps to be performed utilizing a variety of fluids, liquids and/or solutions. Further, due to the nature of substrates such as microelectronic devices, the tolerance range for any degree of error or non-conformance to manufacturing standards is extremely low. Variability of treatment processes for microelectronic devices can be introduced by the difficulty to control the timing of fluid delivery to the substrate(s) and the concentration and the temperature of chemicals used in the processes, particularly when comparing intra-substrate and inter-substrate uniformity of the treatment processes.

There continues to be a need to address variabilities (e.g., timing of fluid delivery to the substrate(s), fluid temperature, fluid composition, combinations of these, and the like) associated with systems and methods of processing one or more substrates.

SUMMARY OF THE INVENTION

The present invention uses a diversion valve in substrate processing systems and methods in a unique manner to isolate timing variabilities associated with dispensing two or more process fluids in sequence onto a substrate. The diversion valve can deliver two or more fluids through a common pipe or line to a dispensing device and onto a substrate, yet the diversion valve can also isolate at least one or more variabilities upstream of the diversion valve from being transferred to a substrate that is positioned in a manner to receive fluid from the dispensing device. Such variabilities include one or more of timing variability associated with valve actuation of valves upstream of the diversion valve, and transient conditions of process fluids (e.g., temperature, pressure, composition, combinations of these, and the like). The diversion valve can divert the flow of a process fluid away from the dispensing device (e.g., to a drain) until the process fluid is at a target process condition. After the process fluid reaches a target condition, the diversion valve can deliver the process fluid to the dispensing device and onto the one or more substrates. Advantageously, one or more variabilities that originate upstream of the diversion valve can be diverted away from the dispensing device and one or more substrates while the fluid reaches a target condition. Otherwise, if the diversion valve was not used in such a manner, such variabilities could be transferred to the one or more substrates and impact the intra-substrate and/or inter-wafer uniformity to an undue degree.

In addition, the diversion valve can deliver two or more process fluids in sequence to a dispensing device through a common line or pipe between the diversion valve and the dispensing device. Advantageously, any variation in the actuation of the diversion valve can apply symmetrically among the two or more process fluids, which can cancel or remove such variation from impacting the uniformity of the one or more substrates to an undue degree.

According to one aspect of the present invention, a system for processing one or more substrates includes a support for positioning the one or more substrates in a manner to be processed, a fluid dispensing device positioned in a manner to dispense a fluid onto the one or more substrates, a valve in fluid communication with the fluid dispensing device, a first fluid pathway between the valve and the fluid dispensing device, at least a second fluid pathway and a third fluid pathway, a first fluid source in fluid communication with the valve, a second fluid source in fluid communication with the valve, and program instructions. Each of the second and third pathways can discharge a fluid from the valve and divert the fluid flow from the first fluid pathway. The program instructions include (i) causing the first fluid to flow through the first fluid pathway, (ii) after instruction (i), diverting the first fluid flow from the first fluid pathway by causing the first fluid to flow through the second fluid pathway, (iii) after instruction (ii), causing the second fluid to flow through the third fluid pathway, (iv) after instruction (iii), causing the second fluid to flow through the first fluid pathway, (v) after instruction (iv), diverting the second fluid flow from the first fluid pathway by causing the second fluid to flow through the third fluid pathway, (vi) after instruction (v), causing the first fluid to flow through the second fluid pathway, and (vii) after instruction (vi), causing the first fluid to flow through the first fluid pathway.

According to another aspect of the present invention, a system for processing one or more substrates includes a plurality of single wafer process stations. One or more of the plurality of single wafer process stations each include a support for positioning the one or more substrates in a manner to be processed, a fluid dispensing device positioned in a manner to dispense a fluid onto the one or more substrates, a valve in fluid communication with the fluid dispensing device, a first fluid pathway between the valve and the fluid dispensing device, at least a second fluid pathway and a third fluid pathway, a first fluid source in fluid communication with the valve, a second fluid source in fluid communication with the valve, and program instructions. Each of the second and third pathways can discharge a fluid from the valve and divert the fluid flow from the first fluid pathway. The program instructions include (i) causing the first fluid to flow through the first fluid pathway, (ii) after instruction (i), diverting the first fluid flow from the first fluid pathway by causing the first fluid to flow through the second fluid pathway, (ii) after instruction (ii), causing the second fluid to flow through the third fluid pathway, (iv) after instruction (iii), causing the second fluid to flow through the first fluid pathway, (v) after instruction (iv), diverting the second fluid flow from the first fluid pathway by causing the second fluid to flow through the third fluid pathway, (vi) after instruction (v), causing the first fluid to flow through the second fluid pathway, (vii) after instruction (vi), causing the first fluid to flow through the first fluid pathway.

According to another aspect of the present invention, a system for processing one or more substrates includes a support for positioning the one or more substrates in a manner to be processed, a fluid dispensing device positioned in a manner to dispense a fluid onto the one or more substrates, a valve in fluid communication with the fluid dispensing device, a first fluid pathway between the valve and the fluid dispensing device, at least a second fluid pathway and a third fluid pathway, a first fluid source in fluid communication with the valve, a second fluid source in fluid communication with the valve, and program instructions. Each of the second and third pathways can discharge a fluid from the valve and divert the fluid flow from the first fluid pathway. The program instructions include (i) causing the second fluid to flow through the third fluid pathway, (ii) after instruction (i), causing the second fluid to flow through the first fluid pathway, (iii) after instruction (ii), diverting the second fluid flow from the first fluid pathway by causing the second fluid to flow through the third fluid pathway, (iv) after instruction (iii), causing the first fluid to flow through the second fluid pathway, and (v) after instruction (iv), causing the first fluid to flow through the first fluid pathway.

According to another aspect of the present invention, a system for processing one or more substrates includes a plurality of single wafer process stations. One or more of the plurality of single wafer process stations each include a support for positioning the one or more substrates in a manner to be processed, a fluid dispensing device positioned in a manner to dispense a fluid onto the one or more substrates, a valve in fluid communication with the fluid dispensing device, a first fluid pathway between the valve and the fluid dispensing device, at least a second fluid pathway and a third fluid pathway, a first fluid source in fluid communication with the valve, a second fluid source in fluid communication with the valve, and program instructions. Each of the second and third pathways can discharge a fluid from the valve and divert the fluid flow from the first fluid pathway. The program instructions include (i) causing the second fluid to flow through the third fluid pathway, (ii) after instruction (i), causing the second fluid to flow through the first fluid pathway, (iii) after instruction (ii), diverting the second fluid flow from the first fluid pathway by causing the second fluid to flow through the third fluid pathway, (iv) after instruction (iii), causing the first fluid to flow through the second fluid pathway, and (v) after instruction (iv), causing the first fluid to flow through the first fluid pathway.

According to another aspect of the present invention, a method of processing one or more substrates comprising the steps of (a) providing a valve in fluid communication with a fluid dispensing device, wherein a first fluid pathway extends between the valve and the fluid dispensing device and at least a second fluid pathway and a third fluid pathway, wherein each of the second and third fluid pathways can discharge a fluid from the valve in a manner that diverts the fluid flow from the first fluid pathway, (b) providing a first fluid source and a second fluid source in fluid communication with the valve, (c) causing the first fluid to flow through the first fluid pathway, (d) after step (c), diverting the first fluid flow from the first fluid pathway by causing the first fluid to flow through the second fluid pathway, (e) after step (d), causing the second fluid to flow through the third fluid pathway, (f) after step (e), causing the second fluid to flow through the first fluid pathway, (g) after step (f), diverting the second fluid flow from the first fluid pathway by causing the second fluid to flow through the third fluid pathway, (h) after step (g), causing the first fluid to flow through the second fluid pathway, and (i) after step (h), causing the first fluid to flow through the first fluid pathway.

In preferred embodiments, the second fluid pathway and the third fluid pathway are the same fluid pathway.

According to another aspect of the present invention, a system for processing one or more substrates includes a support for positioning a substrate in a manner to be processed, a fluid dispensing device positioned in a manner to dispense a fluid onto the one or more substrates, a valve having at least one fluid entrance and at least two fluid exits, a first fluid source in fluid communication with a fluid entrance of the valve, a second fluid source in fluid communication with a fluid entrance of the valve, and program instructions. At least one fluid exit of the valve is in fluid communication with the fluid dispensing device and at least one fluid exit of the valve diverts the fluid flow entering the valve away from the fluid dispensing device. The first fluid and the second fluid can exit the valve fluid exit that is in fluid communication with the fluid dispensing device. The program instructions include (i) causing the first fluid to flow into a fluid entrance of the valve and flow out of a first fluid exit of the valve that is in fluid communication with the fluid dispensing device, (ii) after instruction (i), diverting the first fluid flow from the first fluid exit by causing the first fluid to flow out of a second fluid exit of the valve, (iii) after instruction (ii), causing the second fluid to flow into a fluid entrance of the valve and flow out of a third fluid exit of the valve, (iv) after instruction (iii), causing the second fluid to flow out of the first fluid exit of the valve, (v) after instruction (iv), diverting the second fluid flow from the first fluid exit by causing the second fluid to flow out of the third fluid exit of the valve, (vi) after instruction (v), causing the first fluid to flow out of the second fluid exit of the valve, and (vii) after instruction (vi), causing the first fluid to flow out of the first fluid exit of the valve.

In preferred embodiments, the second fluid exit of the valve and the third fluid exit of the valve are the same fluid exit of the valve.

DETAILED DESCRIPTION

Figure 1:
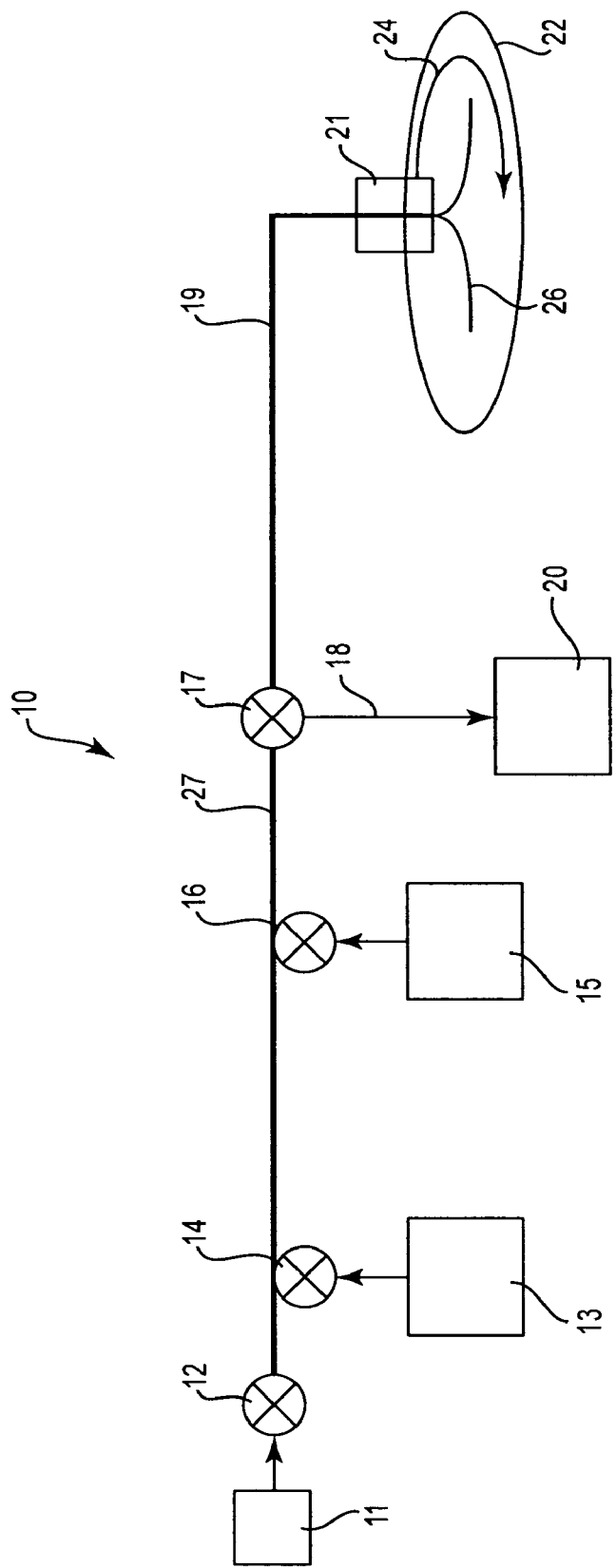
FIG. 1 shows a schematic diagram of a system according to the present invention.

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention. While the present invention will be described in the specific context of microelectronic substrate processing systems, the principles of the invention are applicable to substrate processing systems other than microelectronic substrate processing systems as well.

The present invention may be used in any number of treatment processes applicable to semiconductor devices, such as etching, cleaning, rinsing, oxidizing, deposition, plating, stripping, and the like. The majority of the present description will be directed to discussion of etching treatments as an exemplary application. Etching treatments in particular benefit from the present inventive process because of their high sensitivity to variation due to transient effects related fluid dispense (e.g., timing of fluid dispense effects, concentration effects, and temperature effects), the high degree of precision particularly desired in this treatment process, and the widespread application of this treatment process in mass production manufacturing where variability from product to product is problematic. It will be understood that the processes as described in the etching context can similarly be applied as appropriate in other treatment processes.

In the figures below, the same reference character is used to represent the same feature among the figures.

FIG. 1 shows a schematic diagram of a system 10 according to the present invention that can process substrate 22. System 10 includes a source 13 of a first process fluid and a source 15 of a second process fluid that are each in fluid communication with dispensing device 21 via pipes 19 and 27. From device 21, fluid can be dispensed onto substrate 22 as indicated by 26.

The source 13 of first fluid and source 15 of second fluid can include any fluids used to treat substrate 22, especially in the context of etching a microelectronic substrate. As used herein, "fluid" means liquid, gas, and combinations of these. Examples of specific first and second fluids are described below, e.g., in connection with Tables 1-6. As shown in FIG. 1, the delivery of first fluid from source 13 to pipe 27 can be controlled using first fluid valve 14 and the delivery of second fluid from source 15 to pipe 27 can be controlled using second fluid valve 16.

Dispensing device 21 can deliver a process fluid to a substrate 22 positioned adjacent to the outlet of device 21. Such dispensing devices are well known and can include a center dispense type mechanism that delivers a quantity of process fluid substantially to the center of substrate 22 and the fluid can disperse towards the outer perimeter of substrate 22, thereby contacting the surface of the substrate 22 to be treated. Optionally, substrate 22 can be rotated as indicated by arrow 24. Depending on rotational speed (revolutions per minute), rotating substrate 22 can help disperse a process fluid over the surface of substrate 22 and/or help remove a process fluid from the surface of substrate 22. An alternative dispensing device (not shown) includes a spray bar having a dispensing/nozzle footprint that substantially spans the radius of substrate 22. The output of such a spray bar can be positioned adjacent to the surface of substrate 22 to be treated such that process fluid can be dispensed from the spray bar device and onto substrate 22.

According to the invention, system 10 also includes fluid diversion valve 17. As shown, fluid diversion valve 17 can direct fluid from pipe 27 to pipe 19 or pipe 18. If pipe 19 is selected, fluid can be delivered to dispensing device 21 and onto substrate 22 as indicated by 26. If pipe 18 is selected, fluid can be delivered to diversion destination 20 (e.g., drain). Also as shown, source 13 of first fluid and source 15 of second fluid are plumbed into valve 17 via pipe 27. Alternatively, fluid from source 13 and fluid from source 15 could be plumbed into valve 17 using separate pipes/lines instead of common pipe 27. For example, valve 17 could include a manifold configuration having multiple, independently actuated plugs or valve 17 could have a y-fitting at the valve entrance so as to merge fluid from source 13 and fluid from source 15.

As discussed below in connection with FIG. 2, fluid diversion valve 17 can be used in a manner according to the present invention that advantageously isolates certain variabilities upstream from valve 17, thereby preventing such variabilities from being transferred downstream of valve 17 such as out of dispensing device 21 and onto substrate 22.

Fluid diversion valves such as valve 17 are well known and can be commercially obtained under the trade name INTEGRA® from Entegris, Chaska, Minn.

As shown in FIG. 1, system 10 can optionally include a source 11 of gas such as nitrogen, argon, air, and the like. An inert gas such as nitrogen is typically used in a system such as system 10 to purge one or more of pipes 18, 19, and 27 of liquid. As shown, the flow of an inert gas into pipe 27 can be controlled via valve 12.

When using system 10 to, e.g., etch a microelectronic substrate such as a wafer the duration of etching can be a challenge to manage so as to achieve high repeatability (e.g., run to run for a single wafer station and/or among multiple stations). Variations in the duration of etching can be caused by, e.g., one or more factors such as: 1) a difference in two (2) inches of a ¼ inch inner diameter pipe, with a flow rate of one (1) liter per minute can cause a difference in etch duration of 0.1 second; 2) a difference of 55 cubic centimeters/SEC in the initial transient flow rate of a 1000 cubic centimeter target flow in a 3 foot length of ¼ inch inner diameter piping cause a difference in etch duration of 0.1 second; 3) the length of tubing conducting the pneumatic actuator signal to the valve can impact the response time of the valve; 4) the pressure of the pneumatic actuator signal at the source of the signal, which can vary with gas demand required to actuate other valves, can impact the response time of a valve; and 5) the response time of individual valves to identical actuation pressures.

Figure 2:
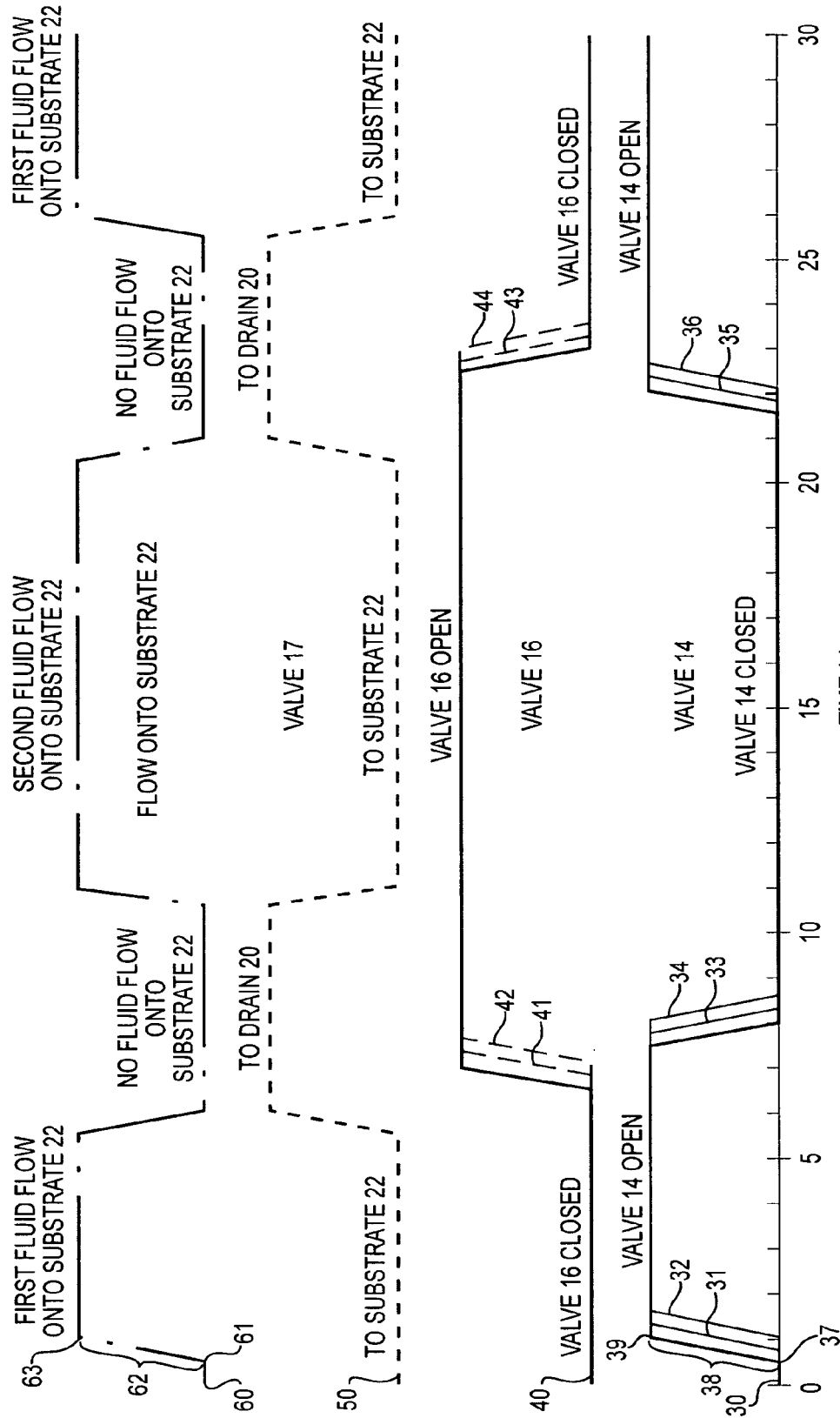
FIG. 2 shows a timing diagram in connection with the system shown in FIG. 1.

FIG. 2 illustrates a timing diagram of actuation of valves 14, 16, and 17, in connection with the system 10 shown in FIG. 1. In particular, FIG. 2 shows an exemplary treatment schedule that illustrates how valve 17 can be used according to the present invention in system 10. It is also noted that the diagram in FIG. 2 represents the timing of valve actuation, not necessarily the timing associated with a pneumatic or electrical signal sent to actuate a valve. As shown in FIG. 2, line 30 represents whether valve 14 is open or closed. If valve 14 is open, process fluid from source 13 can flow into pipe 27. If valve 14 is closed, process fluid from source 13 cannot flow into pipe 27. Line 40 represents whether valve 16 is open or closed. If valve 16 is open, process fluid from source 15 can flow into pipe 27. If valve 16 is closed, process fluid from source 15 cannot flow into pipe 27. Line 50 represents whether diversion valve 17 is selected to direct process fluid flow to pipe 19 or to pipe 18. If diversion valve 17 is selected to direct process fluid flow to pipe 19, the process fluid can be dispensed from dispensing device 21 and onto substrate 22 as indicated by 26. If diversion valve is selected to direct process fluid flow to pipe 18, the process fluid can be delivered to any desired destination such as a reclaiming mechanism or drain 20. Line 60 represents whether or not a process fluid is flowing onto substrate 22. If a fluid is flowing onto substrate 22, line 60 also identifies whether the first fluid or second fluid is flowing onto substrate 22.

At time=0, valve 14 is completely closed as indicated by point 37. Also at t=0, valve 16 is closed such that no flow of second process fluid is permitted from source 15 into pipe 27, and diversion valve 17 is selected to direct fluid flow to pipe 19 and onto substrate 22. As indicated by line 60 at t=0, there is no flow onto substrate 22.

At t=0.5 seconds, valve 16 remains closed, valve 17 remains selected towards pipe 19, and valve 14 opens, thereby permitting first fluid to flow from source 13, into pipe 27, through valve 17, and onto substrate 22. The portion 38 of line 30 is diagonal, thereby indicating that it takes an amount of time for valve 14 to be fully open as indicated by point 39. Portions 31 and 32 of line 30 indicate variations in time as to when valve 14 is opened. Similar to portion 38, lines 31 and 32 are diagonal to show that it takes an amount of time to open valve 14.

Also at t=0.5 seconds, line 60 shows that fluid flow onto substrate 22 goes from no flow as indicated by point 61 to full flow as indicated by point 63. The portion 62 between points 61 and 62 is diagonal and corresponds to portion 38 of line 30, thereby indicating that it takes an amount of time for fluid flow onto to substrate 22 to go from "no flow" to "full flow" since it takes an amount of time to fully open valve 14.

First fluid can flow onto substrate 22 for any desired time period so as to treat substrate 22. As shown, at about t=6 seconds, valve 14 remains open so as to allow first fluid to flow into pipe 27 but diversion valve 17 diverts the flow of first fluid from pipe 19 to pipe 18 and destination 20 (e.g., a drain). As can be seen from line 60, directing fluid flow from pipe 19 stops the flow of first fluid onto substrate 22. Typically, an amount of first fluid remains in pipe 19 after the flow of first fluid is diverted away from pipe 19.

At about t=6.5 seconds, while valve 14 remains open, line 40 shows that valve 16 opens, thereby allowing the second fluid to flow from source 15 into pipe 27, through valve 17, and into pipe 18 and destination 20. Similar to lines 31 and 32, lines 41 and 42 indicate variations in time as to when valve 16 is opened. See discussion of FIG. 3 below in connection with an exemplary range of time as to when valve 16 can be opened.

Because the first fluid and the second fluid are delivered to valve 17 via the same pipe 27 and diverted from pipe 19 to the same pipe 18, the flow of the first fluid is preferably stopped from flowing into pipe 27 before the second fluid is allowed to flow onto substrate 22. If the first fluid is not stopped from flowing into pipe 27 before the second fluid is directed onto substrate 22, a mixture of the first fluid and the second fluid is delivered to substrate 22, which may be undesirable.

As shown in FIG. 2, at about t=7.5 seconds, while valve 16 remains open, valve 14 closes, thereby stopping the flow of the first fluid from source 13 into pipe 27. In certain embodiments, the flow of the first fluid into pipe 27 can be stopped by closing valve 14 at substantially the same time that diversion valve 17 diverts the flow of first fluid from pipe 19 to pipe 18 (e.g., at t=6 seconds in FIG. 2). Similar to lines 31 and 32, lines 33 and 34 show variations in time as to when valve 14 may actually close. See discussion of FIG. 3 below in connection with an exemplary range of time as to when valve 14 can be closed.

The second fluid continues to flow from source 15 through diversion valve 17 and towards destination 20 until about t=10.5 seconds. At t=10.5 seconds, diversion valve 17 switches in a manner that diverts the flow of second fluid from pipe 18 to pipe 19, through dispensing device 21, and onto substrate 22. It is noted that as valve 17 switches the flow of second fluid to pipe 19, the second fluid purges the first fluid that remains in pipe 19 from when the first fluid flow was diverted from pipe 19 as discussed above. Using diversion valve 17 in the manner just described has one or more advantages. For example, allowing the second fluid to flow to destination 20 first, instead of to substrate 22, can allow the flow of second fluid to stabilize with respect to one or more of the second fluid composition, the second fluid temperature, and the like, before the second fluid is dispensed onto substrate 22. Allowing the second fluid to stabilize in such a manner can significantly increase the inter-substrate uniformity (between successively treated substrates) and/or intra-substrate uniformity (within a given substrate). As another advantage, causing the flow of the second fluid to flow into pipe 27 and stopping the flow of the first fluid into pipe 27 while valve 17 is directed to pipe 18 can allow variations such as the timing of the opening of valve 16 (see 41 and 42) and the timing of the closing of valve 14 (see 33 and 34) to be isolated from substrate 22. As mentioned, once the flow of the second fluid is stabilized, then valve 17 can direct the flow of the second fluid onto substrate 22.

Second fluid can flow onto substrate 22 for any desired time period so as to treat substrate 22. As shown, at about t=20.5 seconds, valve 16 remains open so as to allow second fluid to flow into pipe 27 but diversion valve 17 diverts the flow of second fluid from pipe 19 to pipe 18 and destination 20 (e.g., a drain). As can be seen from line 60, directing fluid flow from pipe 19 stops the flow of second fluid onto substrate 22. Typically, an amount of second fluid remains in pipe 19 after the flow of second fluid is diverted away from pipe 19.

At about t=21.5 seconds, while valve 16 remains open, line 30 shows that valve 14 opens, thereby allowing the first fluid to flow from source 13 into pipe 27, through valve 17, and into pipe 18 and destination 20. Similar to lines 31 and 32, lines 35 and 36 indicate variations in time as to when valve 14 is opened. See discussion of FIG. 3 below in connection with an exemplary range of time as to when valve 14 can be opened.

Because the first fluid and the second fluid are delivered to valve 17 via the same pipe 27 and diverted from pipe 19 to the same pipe 18, the flow of the second fluid is preferably stopped from flowing into pipe 27 before the first fluid is allowed to flow onto substrate 22. If the second fluid is not stopped from flowing into pipe 27 before the first fluid is directed onto substrate 22, a mixture of the first fluid and the second fluid is delivered to substrate 22, which may be undesirable.

As shown in FIG. 2, at about t=22.5 seconds, while valve 14 remains open, valve 16 closes, thereby stopping the flow of the second fluid from source 15 into pipe 27. In certain embodiments, the flow of the second fluid into pipe 27 can be stopped by closing valve 16 at substantially the same time that diversion valve 17 diverts the flow of the second fluid from pipe 19 to pipe 18 (e.g., at t=20.5 seconds in FIG. 2). Similar to lines 31 and 32, lines 43 and 44 show variations in time as to when valve 16 may actually close. See discussion of FIG. 3 below in connection with an exemplary range of time as to when valve 16 can be closed.

The first fluid continues to flow from source 13 through diversion valve 17 and towards destination 20 until about t=25.5 seconds. At t=25.5 seconds, diversion valve 17 switches in a manner that diverts the flow of the first fluid from pipe 18 to pipe 19, through dispensing device 21, and onto substrate 22. It is noted that as valve 17 switches the flow of the first fluid to pipe 19, the first fluid purges the second fluid that remains in pipe 19 from when the second fluid flow was diverted from pipe 19 as discussed above. The first fluid can flow onto substrate 22 for any desired time period so as to treat substrate 22. Using diversion valve 17 in the manner just described has one or more advantages. For example, allowing the first fluid to flow to destination 20 first, instead of to substrate 22, can allow the flow of the first fluid to stabilize with respect to one or more of the first fluid composition, the first fluid temperature, and the like, before being dispensed onto substrate 22. Allowing the first fluid to stabilize in such a manner can significantly increase the inter-substrate uniformity (between successively treated substrates) and/or intra-substrate uniformity (within a given substrate). As another advantage, causing the flow of the first fluid to flow into pipe 27 and stopping the flow of second fluid into pipe 27 while valve 17 is directed to pipe 18 can allow variations such as the timing of the closing of valve 16 (see 43 and 44) and the timing of the opening of valve 14 (see 35 and 36) to be isolated from substrate 22. As mentioned, once the flow of the first fluid is stabilized, then valve 17 can direct the flow of the first fluid to substrate 22.

As mentioned above, when the flow of the second fluid is directed to pipe 19 the second fluid purges any of the first fluid that remained in pipe 19 from the previous step. Similarly, when the flow of the first fluid is directed to pipe 19 for the second time the first fluid purges any of the second fluid that remained in pipe 19 from the previous step. Preferably, the amounts of the first fluid and second fluid that are purged onto substrate 22 can be accounted for into the treatment schedule so as to reduce treatment variability and increase treatment uniformity.

Figure 3:
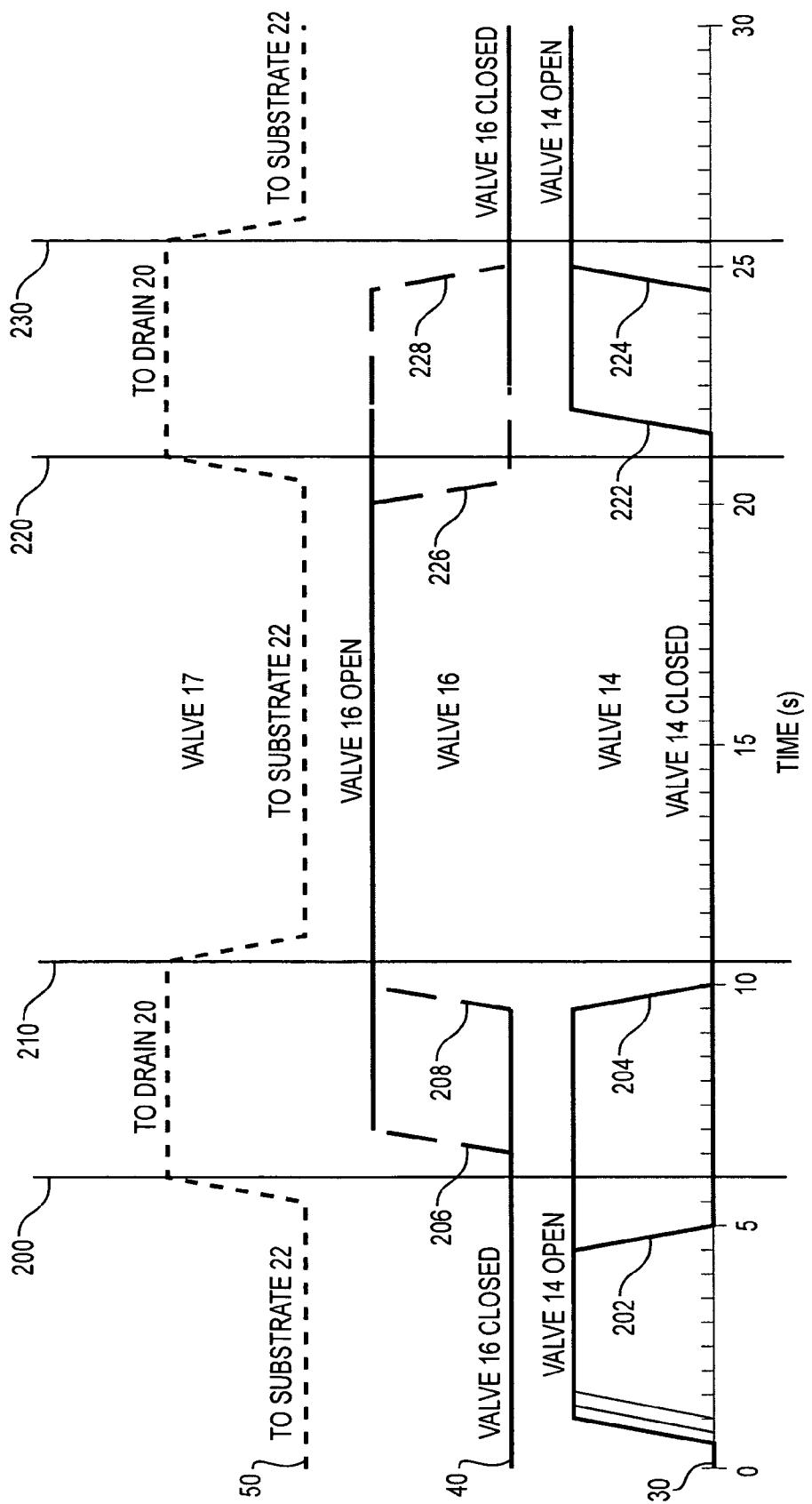
FIG. 3 shows another timing diagram in connection with the system shown in FIG. 1.

Referring to FIG. 3, a timing diagram similar to FIG. 2 is shown that illustrates exemplary ranges of time as to when each of valves 14 and 16 can be opened and closed. When each of valves 14 and 16 are actuated can depend on factors such as geometry of plumbing, the speed of actuation of valves 14 and 16, "cross-talk" among signals that are sent to each of valves 14 and 16, combinations of these, and the like. Vertical line 200 intersects lines 30, 40, and 50, and in particular, intersects line 50 when valve 17 is "fully" diverted to pipe 18 and destination 20 (e.g., a drain). Vertical line 210 intersects lines 30, 40, and 50, and in particular, intersects line 50 when valve 17 begins to divert fluid flow to pipe 19, dispensing device 21, and substrate 22. As shown in FIG. 3, an exemplary range of time as to when valve 14 can be closed extends from line 202 to line 204. Line 202 occurs at a time before (typically shortly before) valve 17 is directed towards pipe 18 from pipe 19, whereas line 204 occurs at a time before valve 17 begins to divert fluid flow to pipe 19. As mentioned above, in certain embodiments the flow of the first fluid into pipe 27 can be stopped by closing valve 14 at substantially the same time that diversion valve 17 diverts the flow of first fluid from pipe 19 to pipe 18. Advantageously, if valve 14 is closed while or as valve 17 is directed towards pipe 19, valve 17 can isolate substrate 22 from variations in timing as to when valve 14 is actually closed. As also shown in FIG. 3, an exemplary range of time as to when valve 16 can be opened extends from line 206 to line 208. Each of lines 206 and 208 occur at a time after valve 17 is "fully" diverted to pipe 18 (line 200) and before valve 17 begins to divert fluid flow to pipe 19 (line 210). Opening valve 16 at a time between lines 200 and 210 can allow the second fluid to stabilize to process conditions before the second fluid contacts substrate 22. Advantageously, any transient conditions of the second fluid can be isolated from substrate 22. Also, variations in timing as to when valve 16 opens can be isolated from substrate 22.

Vertical line 220 intersects lines 30, 40, and 50, and in particular, intersects line 50 when valve 17 is "fully" diverted to pipe 18 and destination 20 (e.g., a drain). Vertical line 230 intersects lines 30, 40, and 50, and in particular, intersects line 50 when valve 17 begins to divert fluid flow to pipe 19, dispensing device 21, and substrate 22. As shown in FIG. 3, an exemplary range of time as to when valve 16 can be closed extends from line 226 to line 228. Line 226 occurs at a time before (typically shortly before) valve 17 is directed towards pipe 18 from pipe 19, whereas line 228 occurs at a time before valve 17 begins to divert fluid flow to pipe 19. As mentioned above, in certain embodiments the flow of the second fluid into pipe 27 can be stopped by closing valve 16 at substantially the same time that diversion valve 17 diverts the flow of second fluid from pipe 19 to pipe 18. Advantageously, if valve 16 is closed while or as valve 17 is directed towards pipe 19, valve 17 can isolate substrate 22 from variations in timing as to when valve 16 is actually closed. As also shown in FIG. 3, an exemplary range of time as to when valve 14 can be opened extends from line 222 to line 224. Each of lines 222 and 224 occur at a time after valve 17 is "fully" diverted to pipe 18 (line 220) and before valve 17 begins to divert fluid flow to pipe 19 (line 230). Opening valve 14 at a time between lines 220 and 230 can allow the first fluid to stabilize to process conditions before the first fluid contacts substrate 22. Advantageously, any transient conditions of the first fluid can be isolated from substrate 22. Also, variations in timing as to when valve 14 opens can be isolated from substrate 22.

Downstream of valve 17, there may be variations that are not isolated by valve 17. However, because at least the first and the second fluid are flowed through the common pipe 19 to dispensing device 21, one or more variations downstream of valve 17 can be prevented from impacting substrate 22. For example, if valve 17 has variations in timing as to when valve 17 switches from pipe 18 to pipe 19 (e.g., similar to variations 31 and 35), preferably valve 17 performs in a consistent manner so that such timing variations cancel each other out. As an example of such cancellation, if valve 17 has a 0.5 sec delay to switch from pipe 18 to pipe 19 and a 0.5 sec delay to switch back to pipe 18 from pipe 19 when dispensing the second fluid, preferably these delays are applied consistently among different fluids that are dispensed using pipe 19 (e.g., when dispensing the first fluid after the second fluid) so that the variations cancel each other out and do not impact substrate 22. Otherwise, if the first and the second fluids are dispensed to dispensing device 21 using separate valves and pipes and such separate valves have different delays, the delays would not be consistent among different fluids and would not cancel each other out.

To help eliminate one or more causes of variability downstream of valve 17, valve 17 is preferably positioned as close to dispensing device 21 as practically possible. As the distance between valve 17 and dispensing device is reduced, flow rate variations downstream of valve 17 tend to not cause variations in the fluid transition times through pipe 19.

Table 1 below helps illustrate a specific process recipe that might be used in connection with system 10 of FIG. 1.

Figure 4:
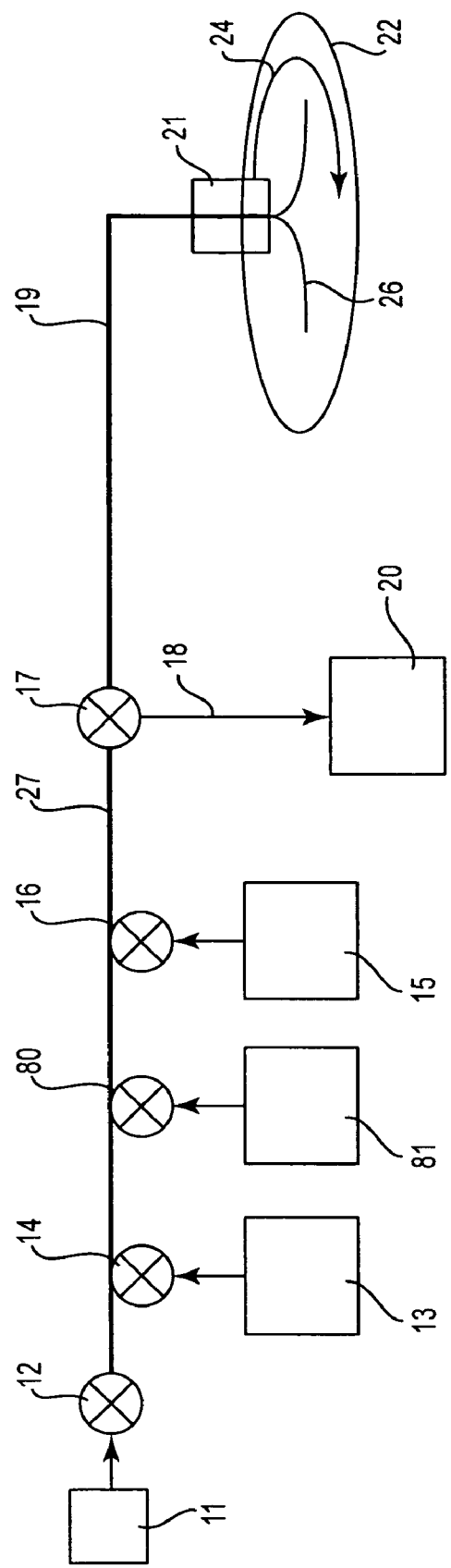
FIG. 4 shows a schematic diagram of the system of FIG. 1 including an optional third fluid source.

Although system 10 is described in FIG. 1 as including first 13 and second 15 fluid sources, system 10 can include one or more sources of process fluids in addition to the first 13 and second 15 fluid sources. For illustration purposes, FIG. 4 shows a schematic diagram of the system of FIG. 1 with an

TABLE 1

Exemplary process recipe for etching a semiconductor substrate with dilute hydrofluoric acid using the system in FIG. 1.

| Step | Duration (seconds) | Valve | Flow (lpm) | Comments |
|---|---|---|---|---|
| 1 | 10 s | 14 open, 16 closed, and 17 to device 21 | 1 | Dispense cold deionized water (CDI) from source 13 onto substrate 22 as a pre-rinse to adjust the temperature of substrate 22 to a target temperature |
| 2 | 5 s | 17 to drain 20, 14 closed and 16 open | 1 | Flow dilute hydrofluoric acid (dHF) from source 15 to drain 20 to flush the water from the pipes upstream of valve 17 and stabilize the flow of dHF |
| 3 | 20 s | 17 to device 21, 16 open, and 14 closed | 1 | Dispense dHF onto substrate 22 |
| 4 | 5 s | 17 to drain 20, 16 closed, and 14 open | 1 | Flow CDI from source 13 to drain 20 to flush the dHF from the channels upstream of valve 17 |
| 5 | 20 s | 17 to device 21, 14 open, and 16 closed | 1 | Dispense CDI onto substrate 22 as a post-rinse to rinse the substrate 22 |
| 6 | 30 s | 17 to device 21, 14 closed, 16 closed, and 12 open | | Dispense nitrogen gas from source 11 to purge water from the channels onto substrate 22 and dry substrate 22 |

Notes:
Flows are in liters per minute (lpm). The purge gas from source 11 may not continue through the entire 30-second drying step.

The diversion valve 17 determines the timing of the start of the etch and the start of the rinse, thereby controlling the exact duration of the etch (steps 3 and 5 in Table 1).

Table 2 below helps illustrate an alternative process recipe that does not use a pre-rinse and that could be used in connection with system 10 of FIG. 1.

optional third fluid source 81. As shown, valve 80 controls the flow of the third fluid from source 81 into pipe 27.

Table 3 below helps illustrate a specific process recipe that might be used in connection with the system shown in FIG. 4. The system shown in FIG. 4 could be used to dispense warm deionized water (WDI) onto substrate 22 either as a pre rinse,

TABLE 2

Alternative exemplary process recipe for etching a semiconductor substrate with dilute hydrofluoric acid using the system in FIG. 1.

| Step | Duration | Valve | Flow (lpm) | Comments |
|---|---|---|---|---|
| 1 | 5 s | 17 to drain 20, 14 closed, and 16 open | 1 | Flow dilute hydrofluoric acid (dHF) from source 15 to drain 20 to fill the channels and stabilize the flow of dHF |
| 2 | 20 s | 17 to device 21, 14 closed, 16 open | 1 | Dispense dHF onto substrate 22 |
| 3 | 5 s | 17 to drain 20, 16 closed, and 14 open | 1 | Flow CDI from source 13 to drain 20 to flush the dHF from the channels upstream of valve 17 |
| 4 | 20 s | 17 to device 21, 14 open, and 16 closed | 1 | Dispense CDI onto substrate 22 as a post-rinse to rinse the substrate 22 |
| 5 | 30 s | 17 to device 21, 14 closed, 16 closed, and 12 open | | Dispense nitrogen gas from source 11 to purge water from the channels onto substrate 22 and dry substrate 22 |

Notes:
Flows are in liters per minute (lpm). The purge gas from source 11 may not continue through the entire 30-second drying step.

System 10 can include one or more additional optional features, useful alone or in combination with each other, as described herein below.

a post rinse, or both. A warm pre-rinse is useful, for instance, to preheat the wafer to match an elevated temperature chemistry of, e.g., dHF.

TABLE 3

Exemplary process recipe for etching a semiconductor substrate
with dilute hydrofluoric acid using the system in FIG. 4.

| Step | Duration | Valve | Flow (lpm) | Comments |
|---|---|---|---|---|
| 1 | 10 s | 14 and 80 open, 16 closed, and 17 to device 21 | Valve 14 - 0.66 lpm Valve 80 - 0.33 lpm | Dispense CDI at 20° C. from source 13 and HDI at 80° C. from source 81 such that WDI at 40° C. is dispensed onto substrate 22 as a pre-rinse to adjust the temperature of substrate 22 to a target temperature |
| 2 | 5 s | 17 to drain 20, valves 14 and 80 closed, and 16 open | 1 | Flow dilute hydrofluoric acid (dHF) from source 15 to drain 20 to flush the water from the channels upstream of valve 17 and stabilize the flow of dHF |
| 3 | 20 s | 17 to device 21, 16 open, and 14 and 80 closed | 1 | Dispense dHF onto substrate 22 |
| 4 | 5 s | 17 to drain 20, 16 closed, and 14 and 80 open | Valve 14 - 0.66 lpm Valve 80 - 0.33 lpm | Dispense CDI at 20° C. from source 13 and HDI at 80° C. from source 81 such that WDI at 40° C. flushes the dHF to drain 20 from the channels upstream of valve 17 |
| 5 | 20 s | 17 to device 21, 14 and 80 open, and 16 closed | Valve 14 - 0.66 lpm Valve 80 - 0.33 lpm | Dispense CDI at 20° C. from source 13 and HDI at 80° C. from source 81 such that WDI at 40° C. is dispensed onto substrate 22 to rinse substrate 22 |
| 6 | 30 s | 17 to device 21, 14 and 80 closed, 16 closed, and 12 open | | Dispense nitrogen gas from source 11 to purge water from the channels onto substrate 22 and dry substrate 22 |

Notes:
Flows are in liters per minute (lpm). The purge gas from source 11 may not continue through the entire 30-second drying step.

Figure 5:
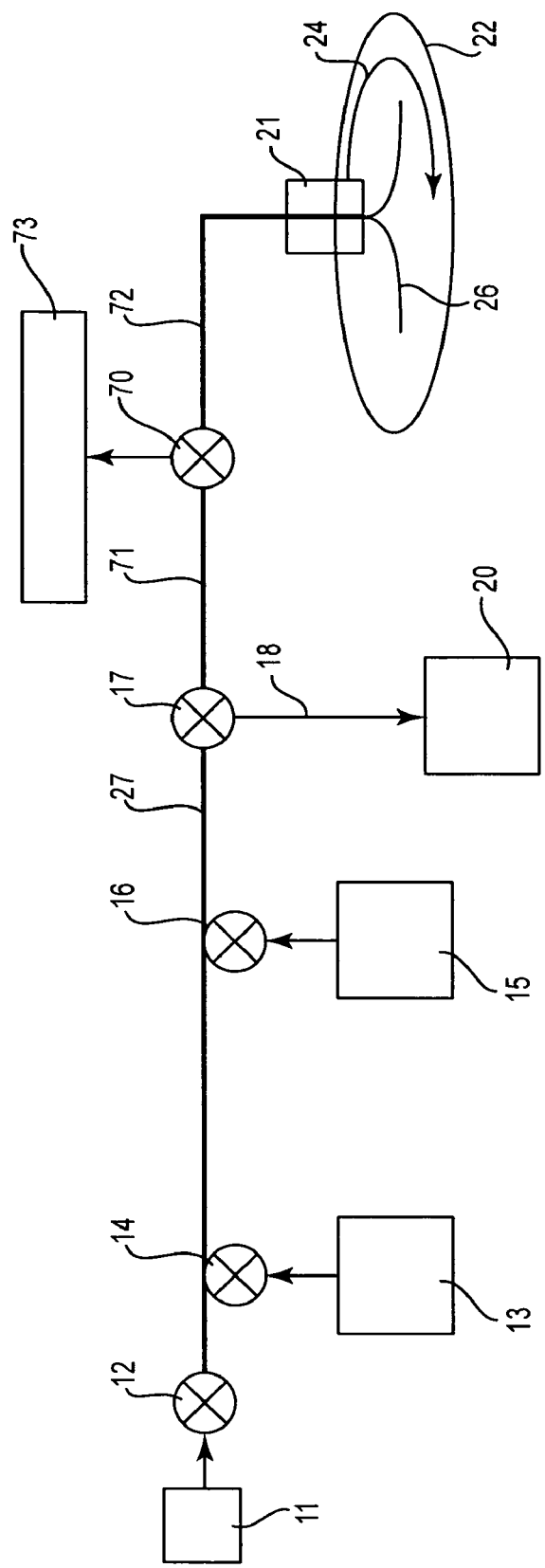
FIG. 5 shows a schematic diagram of the system of FIG. 1 including an optional aspirator mechanism.

FIG. 5 shows a schematic diagram of the system of FIG. 1 with an optional aspirator mechanism 73. As shown, aspirator mechanism 73 is in fluid communication with valve 70. Valve 70 is positioned between diversion valve 17 and dispensing device 21. Valve 70 is in fluid communication with valve 17 via pipe 71 and is in fluid communication with dispensing device 21 via pipe 72. Aspirator mechanism 73 allows fluid to be withdrawn ("sucked back") from pipe 71 and/or pipe 72. If valve 17 is closed to pipe 71 when operating aspirating mechanism 73, the distance between valve 17 and valve 70 is preferably as small as can practically be. Withdrawing fluid from pipes 71 and/or 72 can be desired, e.g., when fluid is not intended to be flowing out of dispensing device 21. Otherwise fluid left standing in pipes 71 and 72 may drip onto substrate 22 as an unintended and undesired consequence. Withdrawing fluid from pipes 71 and/or 72 can also be desired, e.g., when switching between different fluids to be delivered through the common pipes 71 and 72 so that the prior fluid does not have to be purged onto substrate 22 by a subsequent fluid.

Although not shown, one or more optional aspirator mechanisms could be used in other locations of system 10, e.g., in pipe 27, and still remove fluid from pipes 71 and/or 72. Aspirator mechanisms are well known. See, e.g., U.S. Pub. No. 2005/0276909 (Benson et al.), the entirety of which is incorporated herein by reference.

Table 4 below helps illustrate a specific process recipe that might be used in connection with the system shown in FIG. 5. Aspirator mechanism 73 is used to remove the liquid from the dispense pipe 72 after a liquid dispense onto substrate 22 is completed. Liquid from the pre-rinse that would otherwise remain in pipes 71 and 72 tends to dilute the initial flow of dilute hydrofluoric acid (dHF). Likewise, dHF that would otherwise remain in pipes 71 and 72 tends to contaminate the initial flow of post-rinse water. Removing the liquid from pipe 72 can result in reduced dilution and contamination, respectively, resulting in more rapid on-substrate 22 transitions from water to dHF, and from dHF back to water.

TABLE 4

Exemplary process recipe for etching a semiconductor substrate
with dilute hydrofluoric acid using the system in FIG. 5.

| Step | Duration (seconds) | Valve | Flow (lpm) | Comments |
|---|---|---|---|---|
| 1 | 10 s | 14 open, 16 closed, and 17 to device 21 | 1 | Dispense cold deionized water (CDI) from source 13 onto substrate 22 as a pre-rinse to adjust the temperature of substrate 22 to a target temperature |

TABLE 4-continued

Exemplary process recipe for etching a semiconductor substrate with dilute hydrofluoric acid using the system in FIG. 5.

| Step | Duration (seconds) | Valve | Flow (lpm) | Comments |
|---|---|---|---|---|
| 2 | 5 s | 17 to drain 20, aspirator mechanism 73 on, 70 on, 14 closed, and 16 open | 1 | Flow dHF from source 15 to drain 20 to flush the water from the channels upstream of valve 17 and aspirate the water from pipe 72 |
| 3 | 20 s | 17 to device 21, 16 open, 70 closed, and 14 closed | 1 | Dispense dHF onto substrate 22 |
| 4 | 5 s | 17 to drain 20, aspirator mechanism 73 on, 17 on, 16 closed, and 14 open | 1 | Flow CDI from source 13 to drain 20 to flush the dHF from the channels upstream of valve 17 and aspirate the dHF from pipe 72 |
| 5 | 20 s | 17 to device 21, 14 open, 70 closed, and 16 closed | 1 | Dispense CDI onto substrate 22 as a post-rinse to rinse the substrate 22 |
| 6 | 30 s | 17 to device 21, 14 closed, 16 closed, 70 closed, and 12 open | | Dispense nitrogen gas from source 11 to purge water from the channels onto substrate 22 and dry substrate 22 |

Notes:
Flows are in liters per minute (lpm). The purge gas from source 11 may not continue through the entire 30-second drying step.

Figure 6:
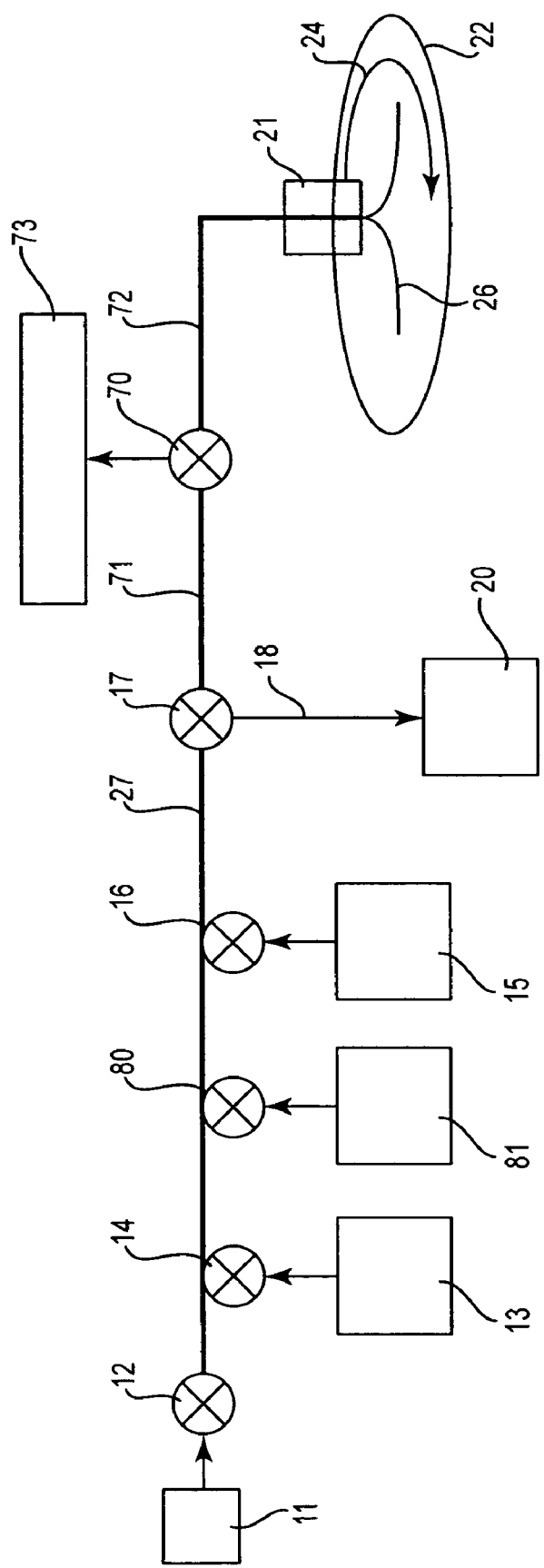
FIG. 6 shows a schematic diagram of the system of FIG. 1 including the optional third fluid source shown in FIG. 4 and optional aspirator mechanism shown in FIG. 5.

FIG. 6 shows a schematic diagram of the system of FIG. 1 including the optional third fluid source shown in FIG. 4 and optional aspirator mechanism shown in FIG. 5.

Figure 7:
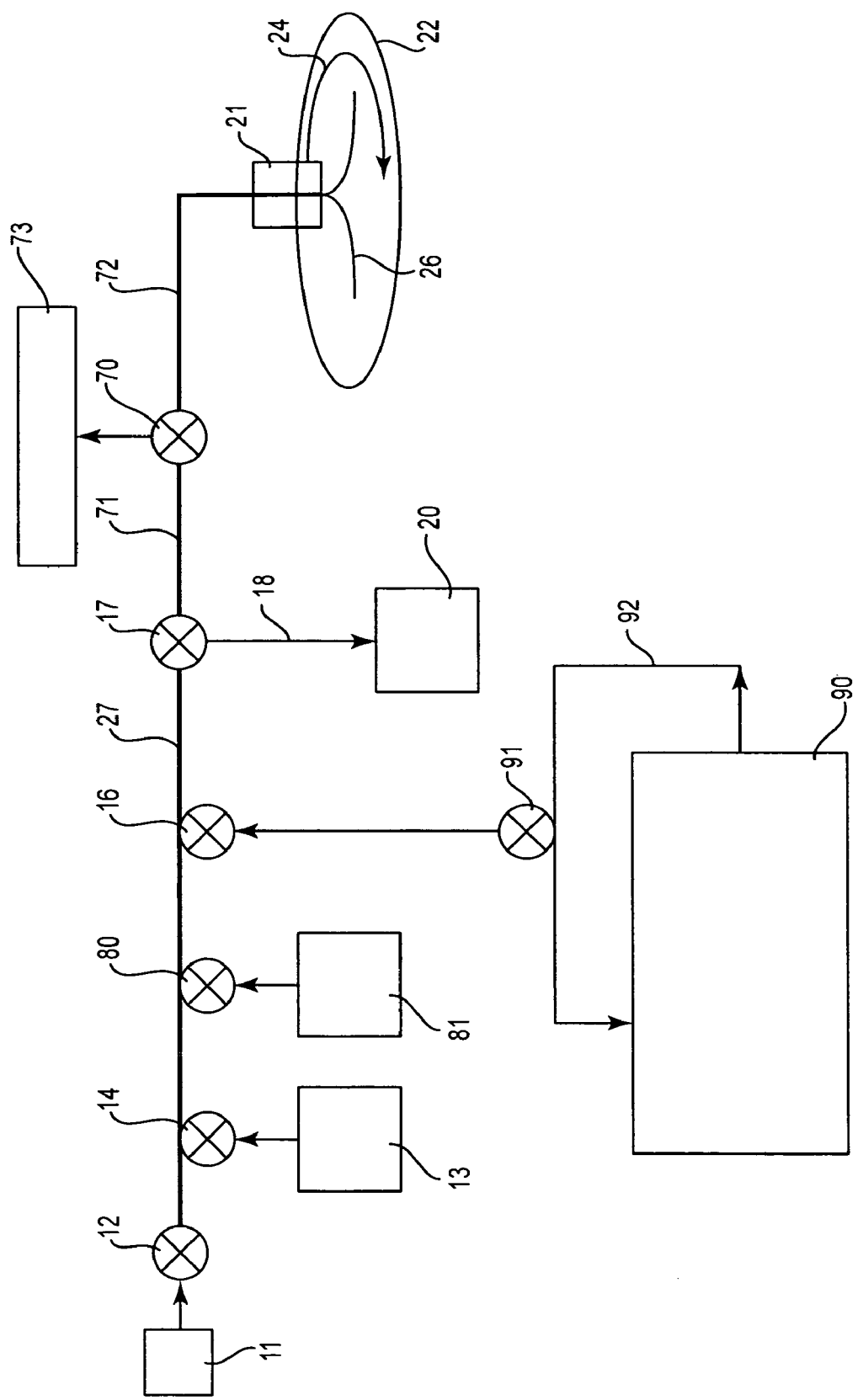
FIG. 7 shows a schematic diagram of the system of FIG. 1 including an optional third fluid source, an optional aspirator, and in the context of where the second fluid source is a recirculation system for the second fluid source.

FIG. 7 shows a schematic diagram of the system of FIG. 1 with an optional third fluid source (see FIG. 4), an optional aspirator (see FIG. 5), and in the context of where the second fluid source is a recirculation system for the second fluid source. As shown, the second fluid is provided from the second fluid recirculation system 90. Valve 91 controls the flow of the second fluid from pipe 92 of the recirculation system 90. Recirculation system 90 can provide and maintain the second fluid at stable process conditions (e.g., temperature, pressure, and composition) and provide the second fluid to pipe 27 on demand. Advantageously, having the second fluid at process conditions on demand via recirculation system 90 can help reduce the time that it would otherwise take to bring the second fluid to one or more process conditions at diversion valve 17.

Table 5 below helps illustrate a specific process recipe that might be used in connection with the system shown in FIG. 7.

The second fluid is recirculated through a closed loop to provide the chemical used to treat the substrate 22. While the details of the recirculation system 90 are not shown in FIG. 7, those skilled in the art will recognize that the recirculation system 90 will typically include a liquid reservoir of the second fluid, a motive element such as a pump, elements to filter the liquid, control the temperature of the liquid, and/or control other characteristics. Process chemistries can be supplied to the reservoir from a pre-mixed source, or blended within the reservoir from stock chemicals. While the chemistry can be supplied directly from a production facilities' bulk distribution network, the use of a recirculation system 90 can isolate substrate 22 from fluctuations in the distribution network. The recirculation system 90 can further improve the repeatability of the chemical treatment by providing an immediately available source of a process chemistry that is pre-blended, temperature controlled and filtered to tight tolerances. While not shown in FIG. 7, it is possible to collect the chemistry after it leaves substrate 22 and return it to the reservoir. This is particularly desirable with high-cost chemistries.

TABLE 5

Exemplary process recipe for etching a semiconductor substrate with dilute hydrofluoric acid using the system in FIG. 7.

| Step | Duration | Valve | Flow (lpm) | Comments |
|---|---|---|---|---|
| 1 | 10 s | 14 and 80 open, 16 and 91 closed, and 17 to device 21 | Valve 14 - 0.66 lpm Valve 80 - 0.33 lpm | Dispense CDI at 20° C. from source 13 and HDI at 80° C. from source 81 such that WDI at 40° C. is dispensed onto substrate 22 as a pre-rinse to adjust the temperature of substrate 22 to a target temperature |
| 2 | 5 s | 17 to drain 20, and 16 and 91 open | 1 | Flow dilute hydrofluoric acid (dHF) from system 90 to drain 20 to flush the water from the channels upstream of valve 17 |

TABLE 5-continued

Exemplary process recipe for etching a semiconductor substrate
with dilute hydrofluoric acid using the system in FIG. 7.

| Step | Duration | Valve | Flow (lpm) | Comments |
|---|---|---|---|---|
| 3 | 20 s | 17 to device 21, 16 and 91 open, and 14 and 80 closed | 1 | Dispense dHF onto substrate 22 |
| 4 | 5 s | 17 to drain 20, 16 and 91 closed, and 14 and 80 open | Valve 14 - 0.66 lpm Valve 80 - 0.33 lpm | Dispense CDI at 20° C. from source 13 and HDI at 80° C. from source 81 such that WDI at 40° C. is stabilized and flushes the dHF to drain 20 from the channels upstream of valve 17 |
| 5 | 20 s | 17 to device 21, 14 and 80 open, and 16 and 91 closed | Valve 14 - 0.66 lpm Valve 80 - 0.33 lpm | Dispense CDI at 20° C. from source 13 and HDI at 80° C. from source 81 such that WDI at 40° C. is dispensed onto substrate 22 to rinse substrate 22 |
| 6 | 30 s | 17 to device 21, 14 and 80 closed, 16 and 91 closed, and 12 open | | Dispense nitrogen gas from source 11 to purge water from the channels onto substrate 22 and dry substrate 22 |

Notes:
Flows are in liters per minute (lpm). The purge gas from source 11 may not continue through the entire 30-second drying step.

In an alternative embodiment of FIG. 7, first fluid valve 14 and third fluid valve 80 could be replaced with a single valve (not shown) that is in fluid communication with a recirculation system as a source for a blend of the first and third fluids. For example, in FIG. 7 the first fluid could be cold deionized water (CDI) and the third fluid could be hot deionized water (HDI). The CDI and the HDI could be blended in pipe 27 to provide warm deionized water at, e.g., at a temperature in the range of from 25° C. to 75° C. In the alternative embodiment, instead of blending the CDI and HDI in pipe 27, the CDI and HDI could be blended in a recirculation system to the desired process conditions and delivered to pipe 27 on demand at said process conditions. Advantageously, such a recirculation system of warm DI saves time because the warm blend is already stabilized and saves hardware because the recirculation system can be a centralized source to a plurality of systems.

Figure 8:
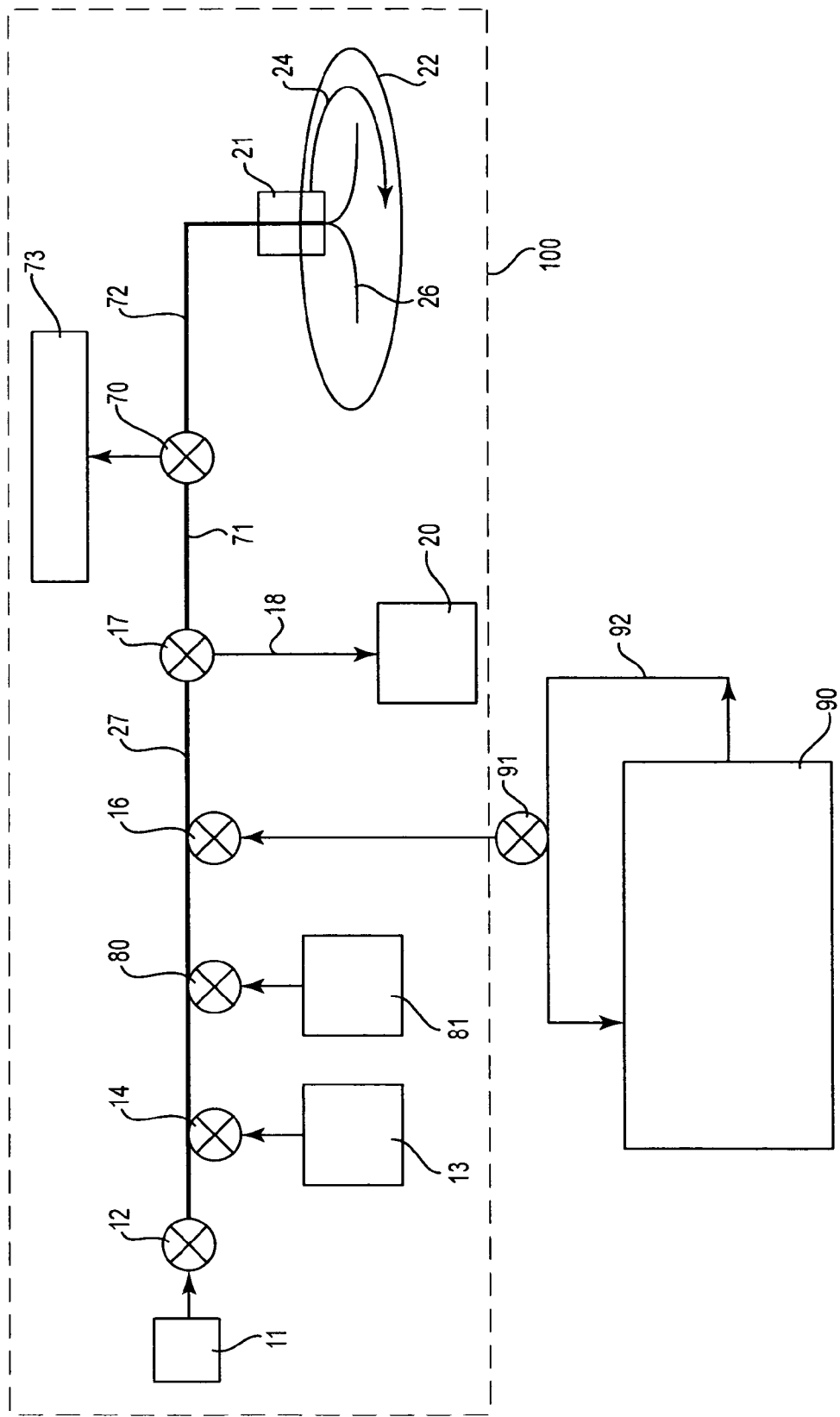
FIG. 8 shows a schematic diagram of the system of FIG. 7 in the context of a single wafer process station.

FIG. 8 shows a schematic diagram of the system of FIG. 7 in the context of recirculation system 90 providing second fluid to single wafer process station 100. Single wafer process stations are well known and include, e.g., the single wafer process station commercialized under the trade name ORION® by FSI, International, Chaska, Minn.

Figure 9:
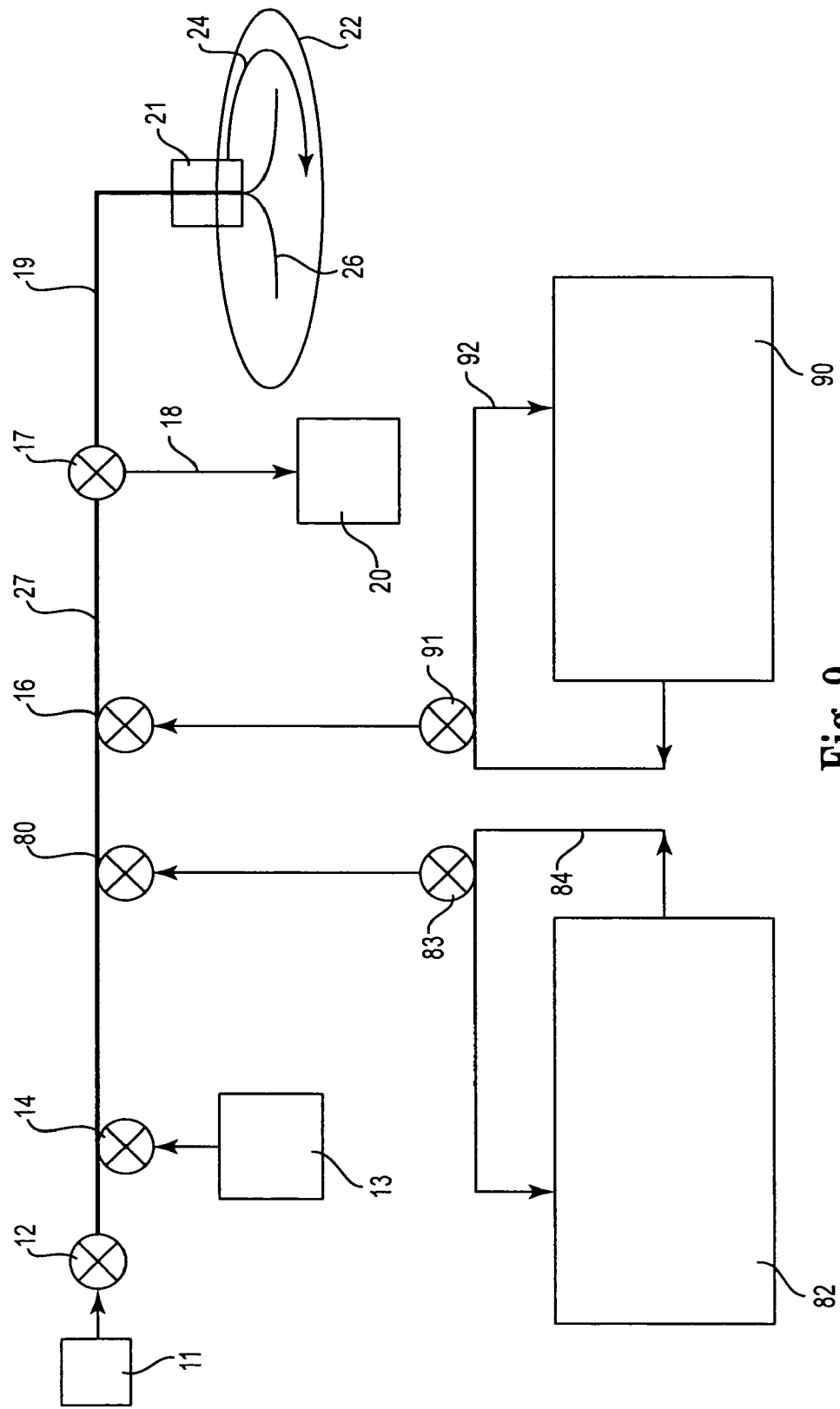
FIG. 9 shows a schematic diagram of the system of FIG. 1 with an optional third fluid source (see FIG. 4), and in the context of where the second fluid source and third fluid source are each a recirculation system for the second fluid source and third fluid source, respectively.

FIG. 9 shows a schematic diagram of the system of FIG. 1 with an optional third fluid source (see FIG. 4), and in the context of where the second fluid source and third fluid source are each a recirculation system for the second fluid source and third fluid source, respectively. As shown, the second fluid is provided from the second fluid recirculation system 90 and the third fluid is provided from the third fluid recirculation system 82. The recirculated chemistries can be dispensed either concurrently or in sequence. Valve 83 controls the flow of the third fluid from pipe 84 of the recirculation system 82. Valve 91 controls the flow of the second fluid from pipe 92 of the recirculation system 90. Recirculation systems 82 and 90 can provide and maintain the third fluid and the second fluid, respectively, at stable process conditions (e.g., temperature, pressure, and composition) and provide the third fluid and the second fluid, respectively, to pipe 27 on demand. Advantageously, having the third fluid and the second fluid at process conditions on demand via recirculation systems 82 and 90, respectively, can help reduce the time that it would otherwise take to bring the third fluid and/or the second fluid to process conditions.

Table 6 below helps illustrate a specific process recipe that might be used in connection with the system shown in FIG. 9.

TABLE 6

Exemplary process recipe for removing photoresist from a semiconductor substrate
with hot, ozonated sulfuric acid (SOM) and etching the semiconductor substrate
with dilute hydrofluoric acid using the system in FIG. 9.

| Step | Duration | Valve | Flow (lpm) | Comments |
|---|---|---|---|---|
| 1 | 30 s | 80 and 83 open, valve 17 to device 21, valves 14, 16, and 91 closed | 1 | Dispense hot SOM to remove the photo resist |
| 2 | 30 s | 14 open, 16 and 91 closed, 80 and 83 closed, and valve 17 to device 21 | 1 | Dispense cold deionized water (CDI) from source 13 onto substrate 22 to rinse away the SOM and as a pre-rinse to adjust the temperature of substrate 22 to a target temperature |
| 3 | 5 s | 17 to drain 20, and 16 and 91 open | 1 | Flow dilute hydrofluoric acid (dHF) from system 90 to drain 20 to flush the water from the channels upstream of valve 17 |

TABLE 6-continued

Exemplary process recipe for removing photoresist from a semiconductor substrate with hot, ozonated sulfuric acid (SOM) and etching the semiconductor substrate with dilute hydrofluoric acid using the system in FIG. 9.

| Step | Duration | Valve | Flow (lpm) | Comments |
|------|----------|-------|------------|----------|
| 4 | 20 s | 17 to device 21, 16 and 91 open | 1 | Dispense dHF onto substrate 22 |
| 5 | 5 s | 17 to drain 20, 16 and 91 closed, and 14 open | 1 | Flow CDI from source 13 to drain 20 to flush the dHF from the channels upstream of valve 17 |
| 6 | 20 s | 17 to device 21, and 14 open | 1 | Dispense CDI onto substrate 22 as a post-rinse to rinse the substrate 22 |
| 7 | 30 s | 17 to device 21, 14 closed, 16 and 91 closed, 80 and 83 closed, and 12 open | | Dispense nitrogen gas from source 11 to purge water from the channels onto substrate 22 and dry substrate 22 |

Notes:
Flows are in liters per minute (lpm). The purge gas from source 11 may not continue through the entire 30-second drying step.

Tables 1-6 above illustrate exemplary process recipes and the durations, flow rates, and chemistries are merely illustrative. One of ordinary skill in the art will readily understand that these parameters can be modified to achieve a particular process result.

Figure 10:
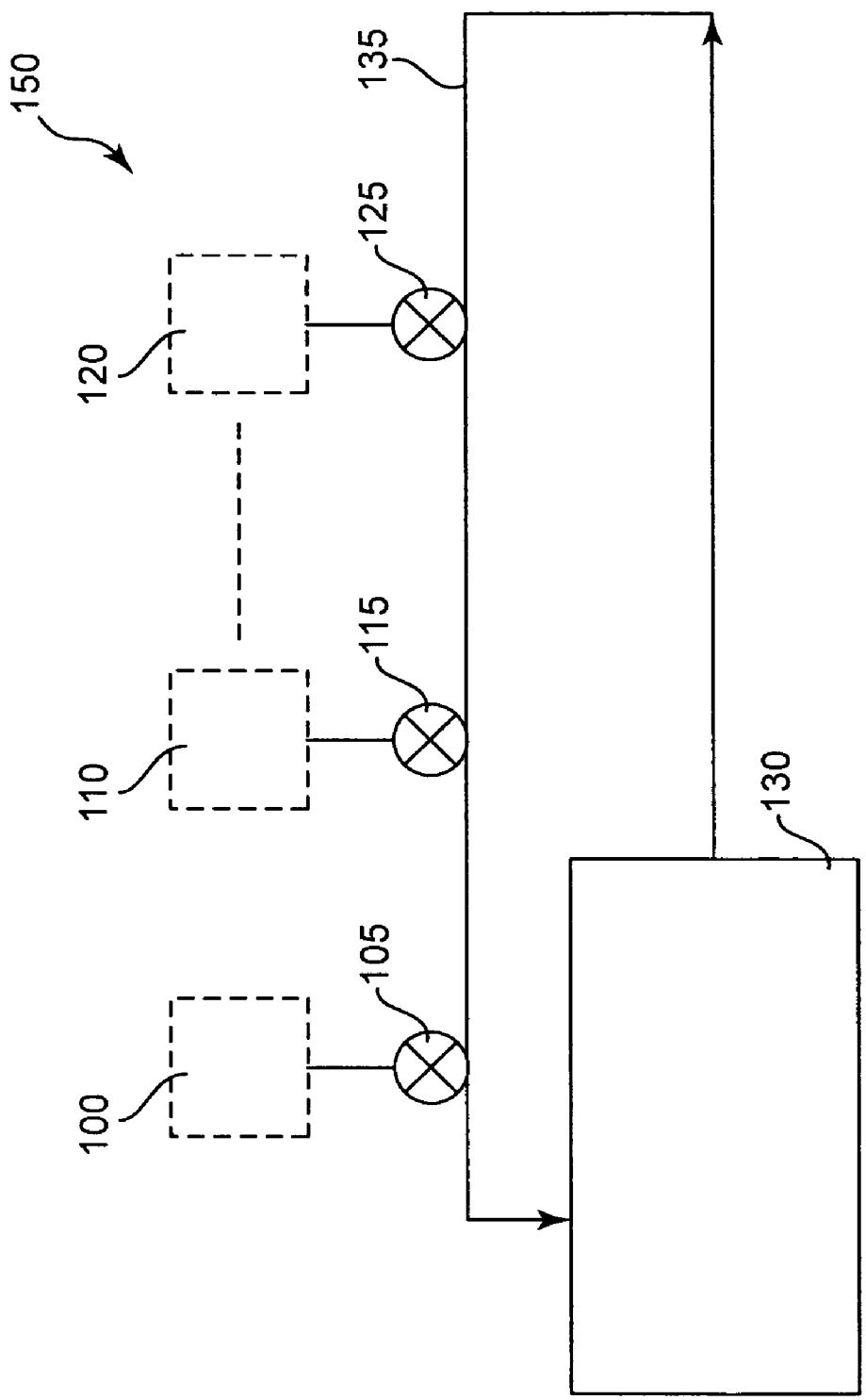
FIG. 10 shows a schematic diagram of a plurality of single wafer process stations, including the single wafer process station shown in FIG. 8, where each single wafer process station is in fluid communication with a recirculation system for the second fluid source.

FIG. 10 shows a schematic diagram of system 150 having a plurality of single wafer process stations, where each single wafer process station is in fluid communication with second fluid recirculation system 130. For illustration purposes, FIG. 10 shows an embodiment having three (3) single wafer process stations as a plurality. As shown, valves 105, 115, and 125 control the flow of the second fluid from pipe 135 of recirculation system 130 to stations 100, 110, and 120, respectively. Recirculation system 130 can provide and maintain the second fluid at stable process conditions (e.g., temperature, pressure, and composition) and provide the second fluid to one or more of stations 100, 110, and 120 on demand. Advantageously, having the second fluid at process conditions on demand via recirculation system 130 can help reduce the time that it would otherwise take to bring the second fluid to process conditions. Also, system 150 can help increase the number of substrates (e.g., wafers) processed per hour as compared to only one single wafer process station, with individual process stations 100, 110, and 120, operating in parallel to simultaneously process multiple wafers.

In a preferred embodiment of FIG. 10, one or more of the plurality of single wafer stations 110 and 120 can include a system having a diversion valve similar to valve 17 in station 100. As discussed above with respect to station 100, if stations 110 and/or 120 have a diversion valve 17 then preferably the valve(s) 17 perform in a consistent manner. Accordingly, if an actuation delay of a given valve 17 is applied consistently among different fluids then the impact of the delay on the substrate is cancelled out. Advantageously, small variations in the actuation delays of the individual valves 17 among stations 100, 110, and 120, will still result in uniform processing among such stations as long as the actuation delay of any particular valve 17 is consistent. For example, if an etching liquid is at substantially the same temperature among all of the stations 100, 110, and 120, and any actuation delay at the beginning and end of the etch is substantially consistent among all of the stations 100, 110, and 120, then the degree of etching among the stations should be uniform for a given time period.

Optionally, system 150 of FIG. 10 can include one or more additional recirculation systems, where each additional recirculation system is a single source for a given process fluid to one or more of stations 100, 110, and 120.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. A system for processing one or more substrates, comprising:
   a. a support for positioning the one or more substrates in a manner to be processed;
   b. a fluid dispensing device positioned in a manner to dispense a fluid onto the one or more substrates;
   c. a valve in fluid communication with the fluid dispensing device;
   d. a first fluid pathway between the valve and the fluid dispensing device;
   e. at least a second fluid pathway and a third fluid pathway, wherein each of the second and third pathways can discharge a fluid from the valve and divert the fluid flow from the first fluid pathway;
   f. a first fluid source comprising a first fluid and in fluid communication with the valve;
   g. a second fluid source comprising a second fluid and in fluid communication with the valve; and
   h. a controller operatively coupled to the valve, wherein the controller comprises program instructions comprising:
      i. causing the first fluid to flow through the first fluid pathway;
      ii. after instruction (i), diverting the first fluid flow from the first fluid pathway by causing the first fluid to flow through the second fluid pathway;
      iii. after instruction (ii), causing the second fluid to flow through the third fluid pathway;
      iv. after instruction (iii), causing the second fluid to flow through the first fluid pathway;
      v. after instruction (iv), diverting the second fluid flow from the first fluid pathway by causing the second fluid to flow through the third fluid pathway;
      vi. after instruction (v), causing the first fluid to flow through the second fluid pathway; and
      vii. after instruction (vi), causing the first fluid to flow through the first fluid pathway.

2. The system of claim 1, wherein the second fluid pathway and the third fluid pathway are the same fluid pathway.

3. The system of claim 1, further comprising the program instruction of, before instruction (iv), stopping the flow of the first fluid to the valve and through the second fluid pathway.

4. The system of claim 3, wherein the flow of the first fluid is stopped at substantially the same time as instruction (ii).

5. The system of claim 3, further comprising the program instruction of, before instruction (vii), stopping the flow of the second fluid to the valve and through the third fluid pathway.

6. The system of claim 5, wherein the flow of the second fluid is stopped at substantially the same time as instruction (v).

7. The system of claim 1, further comprising a third fluid source in fluid communication with the valve, wherein the third fluid source comprises a recirculation system of deionized water at a temperature in the range of from 25° C. to 75° C.

8. The system of claim 1, further comprising an aspirator mechanism fluidly coupled to the first fluid pathway between the valve and the fluid dispensing device.

9. The system of claim 8, wherein the aspirator mechanism comprises a fluid removal pathway fluidly coupled to the first fluid pathway in a manner such that at least a portion of a residual liquid in the first fluid pathway can be withdrawn from the first fluid pathway without purging at least the residual liquid portion through the fluid dispensing device.

10. The system of claim 1, wherein the first fluid comprises deionized water and the second fluid comprises an aqueous solution of hydrofluoric acid.

11. A second system for processing one or more substrates, comprising a plurality of single wafer process stations, wherein one or more of the plurality of single wafer process stations each comprise a first system, wherein the first system is the system of claim 1.

12. The second system of claim 11, wherein one or more of the first fluid source and second fluid source comprise a recirculation system having the respective fluid source recirculating at a process condition.

13. The second system of claim 12, wherein two or more of the plurality of single wafer process stations have the same recirculation system as the fluid source for each respective fluid.

14. A system for processing one or more substrates, comprising:
 a. a support for positioning the one or more substrates in a manner to be processed;
 b. a fluid dispensing device positioned in a manner to dispense a fluid onto the one or more substrates;
 c. a valve in fluid communication with the fluid dispensing device;
 d. a first fluid pathway between the valve and the fluid dispensing device;
 e. at least a second fluid pathway and a third fluid pathway, wherein each of the second and third pathways can discharge a fluid from the valve and divert the fluid flow from the first fluid pathway;
 f. a first fluid source comprising a first fluid and in fluid communication with the valve;
 g. a second fluid source comprising a second fluid and in fluid communication with the valve; and
 h. a controller operatively coupled to the valve, wherein the controller comprises program instructions comprising:
  i. causing the second fluid to flow through the third fluid pathway;
  ii. after instruction (i), causing the second fluid to flow through the first fluid pathway;
  iii. after instruction (ii), diverting the second fluid flow from the first fluid pathway by causing the second fluid to flow through the third fluid pathway;
  iv. after instruction (iii), causing the first fluid to flow through the second fluid pathway; and
  v. after instruction (iv), causing the first fluid to flow through the first fluid pathway.

15. The system of claim 14, further comprising the program instruction of, before instruction (v), stopping the flow of the second fluid to the valve and through the third fluid pathway.

16. The system of claim 15, wherein the flow of the second fluid is stopped at substantially the same time as instruction (iii).

17. A second system for processing one or more substrates, comprising a plurality of single wafer process stations, wherein one or more of the plurality of single wafer process stations each comprise a first system, wherein the first system is the system of claim 14.

18. A system for processing one or more substrates, comprising:
 a. a support for positioning a substrate in a manner to be processed;
 b. a fluid dispensing device positioned in a manner to dispense a fluid onto the one or more substrates;
 c. a valve having at least one fluid entrance and at least two fluid exits, wherein at least one fluid exit is in fluid communication with the fluid dispensing device and at least one fluid exit diverts the fluid flow entering the valve away from the fluid dispensing device;
 d. a first fluid source comprising a first fluid and in fluid communication with a fluid entrance of the valve;
 e. a second fluid source comprising a second fluid and in fluid communication with a fluid entrance of the valve, wherein the first fluid and the second fluid can exit the valve fluid exit that is in fluid communication with the fluid dispensing device; and
 f. a controller operatively coupled to the valve, wherein the controller comprises program instructions comprising:
  i. causing the first fluid to flow into a fluid entrance of the valve and flow out of a first fluid exit of the valve that is in fluid communication with the fluid dispensing device;
  ii. after instruction (i), diverting the first fluid flow from the first fluid exit by causing the first fluid to flow out of a second fluid exit of the valve;
  iii. after instruction (ii), causing the second fluid to flow into a fluid entrance of the valve and flow out of a third fluid exit of the valve;
  iv. after instruction (iii), causing the second fluid to flow out of the first fluid exit of the valve;
  v. after instruction (iv), diverting the second fluid flow from the first fluid exit by causing the second fluid to flow out of the third fluid exit of the valve;
  vi. after instruction (v), causing the first fluid to flow out of the second fluid exit of the valve; and
  vii. after instruction (vi), causing the first fluid to flow out of the first fluid exit of the valve.

19. The system of claim 18, wherein the second fluid exit of the valve and the third fluid exit of the valve are the same fluid exit of the valve.

20. The system of claim 18, further comprising the program instruction of, before instruction (iv), stopping the flow of the first fluid to the fluid entrance of the valve and out of the second fluid exit of the valve.

* * * * *